US011323108B1

(12) United States Patent
Verbruggen et al.

(10) Patent No.: US 11,323,108 B1
(45) Date of Patent: May 3, 2022

(54) LOW CURRENT LINE TERMINATION STRUCTURE

(71) Applicant: XILINX, INC., San Jose, CA (US)

(72) Inventors: Bob W. Verbruggen, Dublin (IE); Christophe Erdmann, Dublin (IE); Ionut C. Cical, Dublin (IE)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 17/107,572

(22) Filed: Nov. 30, 2020

(51) Int. Cl.
  *H04L 25/02* (2006.01)
  *H03K 5/133* (2014.01)
  *H03K 3/037* (2006.01)
  *H05K 1/02* (2006.01)
  *G06F 13/40* (2006.01)

(52) U.S. Cl.
  CPC ......... *H03K 5/133* (2013.01); *G06F 13/4086* (2013.01); *H03K 3/037* (2013.01); *H04L 25/0298* (2013.01); *H05K 1/0246* (2013.01)

(58) Field of Classification Search
  CPC ...... H03K 5/133; H03K 3/037; H05K 1/0246; H04J 2203/0048; H04L 25/0298; H04L 25/0278; H04L 25/028; G06F 13/4086
  See application file for complete search history.

(56) References Cited

U.S. PATENT DOCUMENTS 10,418,994 B1 * 9/2019 Cullen ............... H03K 19/1776

OTHER PUBLICATIONS

M. Mizuno et al., "On-chip multi-GHz clocking with transmission lines," 2000 IEEE International Solid-State Circuits Conference. Digest of Technical Papers (Cat. No. 00CH37056), San Francisco, CA, USA, 2000, pp. 366-367.

Kangmin Hu, Tao Jiang and P. Chiang, "Comparison of on-die global clock distribution methods for parallel serial links," 2009 IEEE International Symposium on Circuits and Systems, Taipei, Taiwan, 2009, pp. 1843-1846.

* cited by examiner

Primary Examiner — Jung Kim
(74) Attorney, Agent, or Firm — Patterson + Sheridan, LLP (57) ABSTRACT

A low current line termination circuit includes first and second input interfaces each configured to receive a Vreceive+ and a Vreceive− voltage, respectively. The circuit further includes a first diode connected transistor ("DCT") coupled to the second input interface, a first switching transistor ("ST") coupled to the first DCT and to the first input interface, and a first delay element coupled between one of the input interfaces and a gate of the first ST. The circuit further includes a second DCT coupled to the one of the two input interfaces, a second ST coupled to the second DCT and to the second input interface, and a second delay element coupled between another of the two input interfaces and a gate of the second ST.

16 Claims, 13 Drawing Sheets

NMOS only

NMOS only, diode
gate middle

LOW CURRENT LINE TERMINATION STRUCTURE

TECHNICAL FIELD

Examples of the present disclosure generally relate to on-die transmission lines, and in particular to low current line termination structures.

BACKGROUND

Long on-die clock or signal lines in high metal layers can have large parasitic inductance and low parasitic resistance. If these lines are switching a capacitive load such as an inverter, significant voltage overshoots can develop at the gate of this inverter, potentially degrading reliability. A conventional approach to dealing with these overshoots is to terminate the line at its destination with a resistor. While this dampens the overshoots, it also requires significant current from the line driver.

It is desired to provide a line termination solution that solves the problems of the prior art.

SUMMARY

Examples described herein relate to low current line termination structures and methods of providing same. In one example, a low current line termination circuit includes first and second input interfaces each configured to receive CLK+ and CLK− signals, respectively. The circuit further includes a first diode connected transistor ("DCT") coupled to the second input interface, a first switching transistor ("ST") coupled to the first DCT and to the first input interface, and a first delay element coupled between one of the two input interfaces and a gate of the first ST. The circuit further includes a second DCT coupled to the first input interface, a second ST coupled to the second DCT and to the second input interface, and a second delay element coupled between another of the two input interfaces and a gate of the second ST.

In another example, a method of providing a low current line termination circuit is described. The method includes providing first and second input interfaces each configured to receive CLK+ and CLK− signals, respectively. The method further includes providing a first current path, the first current path including a first DCT coupled to the second input interface, a first ST coupled to the first DCT and to the first input interface, and a first delay element coupled between one of the two input interfaces and a gate of the first ST. The method still further includes providing a second current path, the second current path including a second DCT coupled to the first input interface, a second ST coupled to the second DCT and to the second input interface, and a second delay element coupled between another of the two input interfaces and a gate of the second ST.

In yet another example, a method of providing sink currents between two endpoints of a clock signal line includes generating, at a first transition of CLK+ and CLK− endpoints of a clock signal line, at least one first current path between the two endpoints, each of the at least one first current paths being in a first direction, and following a first pre-defined delay, disabling each of the at least one first current paths. The method further includes generating, at a second transition of the CLK+ and CLK− endpoints of the clock signal line, at least one second current path between the two endpoints, each of the at least one current paths being in a second direction, the second direction being opposite to the first direction. The method still further includes, following a second pre-defined delay, disabling each of the at least one second current paths.

These and other aspects may be understood with reference to the following detailed description.

BRIEF DESCRIPTION OF DRAWINGS

So that the manner in which the above recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Examples described herein relate to reducing voltage overshoot at the end of inductive lines by providing a current sink. As opposed to conventional terminating structures that require significant current, example termination circuits as described herein reduce current requirements on a line driver by disabling the terminating current after a short amount of time.

It is noted that when distributing clocks over long distances it is advantageous to reduce the number of repeaters to minimize power and added noise. The achievable distance between any two repeaters is thus limited by the bandwidth of the lines connecting these repeaters. In order to maximize this bandwidth, efforts need to be made to minimize line capacitance and resistance. However, this usually implies that line inductance becomes significant, and the line effectively starts behaving as a rather lossy transmission line. In extreme cases, this can result in significant voltage overshoots at the end of the line, which can degrade device reliability due to time-dependent dielectric breakdown (TDDB).

In one or more examples termination structures are provided that draw reduced current from a line driver. However, prior to providing the details of such example termination structures, so as to fully contextualize the described solutions, some conventional approaches are first described.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1A:
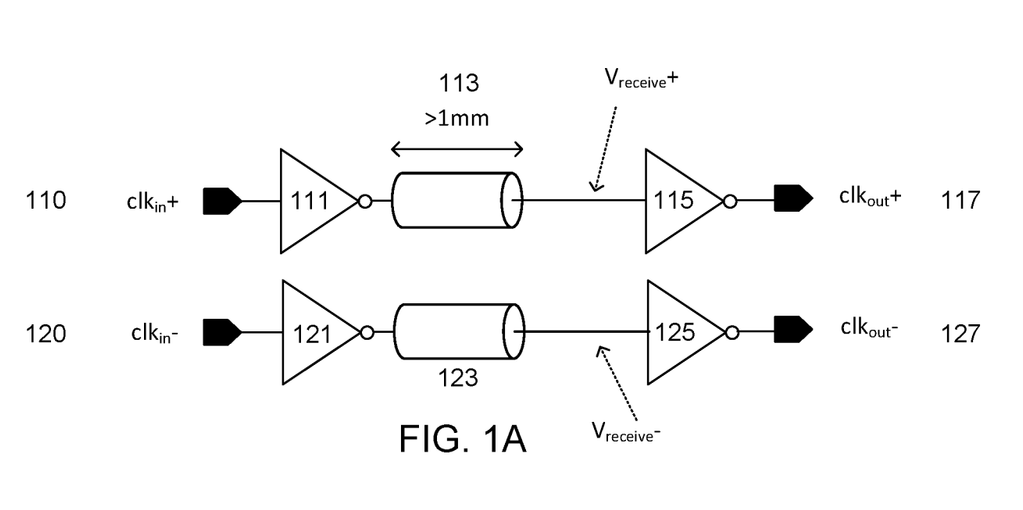
FIG. 1A depicts a conventional unterminated long line clock distribution.

FIG. 1A depicts an example conventional unterminated long line clock distribution. With reference thereto, there are shown two signal lines 110, 120, for example, for a clock signal. Clock signal line 110 carries a clk+ signal, and clock signal line 120 its inverse, a ck− signal. With reference to clock signal line 110, the input signal, $clk_{in}+$ is input to an inverter 111. The output of inverter 111 is provided to a long signal line expanse 113, which is fed into a second inverter 115. The output of inverter 115 is the clkout+ 117. Similarly, provided below the clock signal line 110 is clock signal line 120, which carries the ck− signal. The input signal, $clk_{in-}$ is input to an inverter 121, and just as in the case of the clk+ signal path, the output of inverter 121 is provided to a long signal line expanse 123, which is fed into a second inverter 125. The output of inverter 125 is the clkout− 127.

Figure 1B:
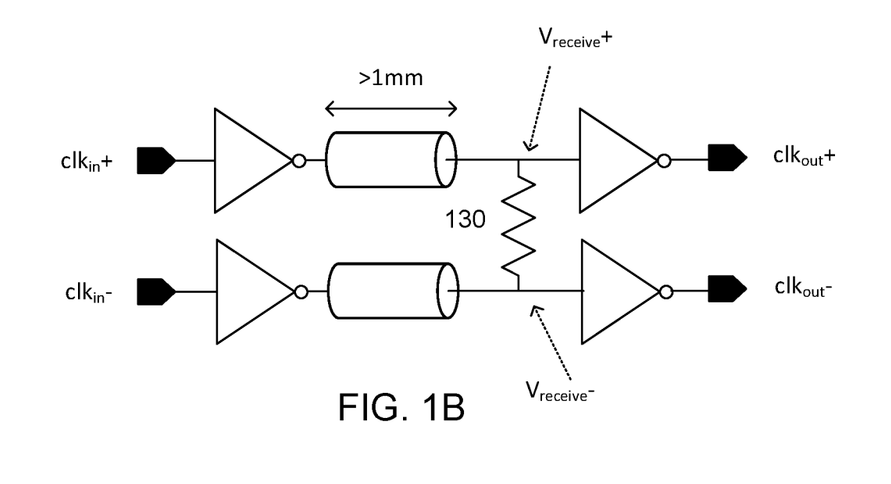
FIG. 1B depicts the conventional long line clock distribution of FIG. 1A with a resistance connected between the Vreceive+ and Vreceive− lines.

It is noted that one conventional solution to overshoots in transmission lines is to match the load impedance to the line impedance. This implies a differential resistor provided between the Vreceive+ and Vreceive− signal lines, as shown in FIG. 1B. Thus, FIG. 1B depicts the conventional long line clock distribution of FIG. 1A with a resistance 130 connected between the Vreceive+ and Vreceive− lines. In all other respects, the line termination of FIG. 1B is identical to that of FIG. 1A. While resistance 130 of the approach of FIG. 1B effectively reduces voltage overshoots, it also requires (draws) a substantial current from the line drivers. Moreover, since it loads the lines, it can adversely affect clock jitter.

Figure 2:
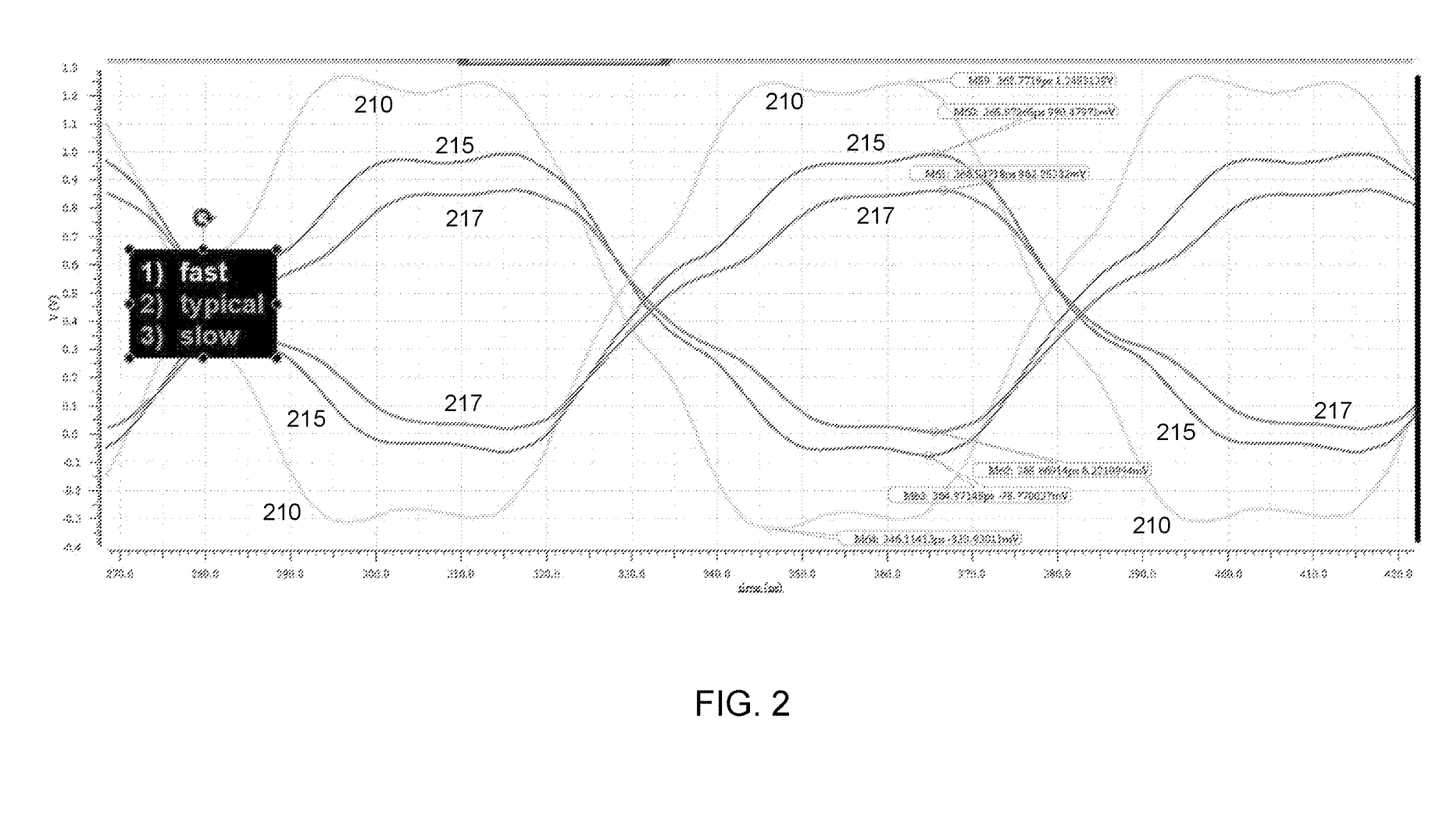
FIG. 2 provides a simulation of Vreceive+ and Vreceive− for the example unterminated long line clock distribution of FIG. 1A.

To illustrate the extent of overshoot, FIG. 2 provides simulation results for the Vreceive+ and Vreceive− clock signals, as shown in FIG. 1A, for the example unterminated long line clock distribution structure of FIG. 1A. With reference thereto, there are shown three signal plots for each of Vreceive+ and Vreceive− signals. These are a first plot 210 for a fast device corner, a second plot 215 for a typical corner, and a third plot 217 for a slow corner. As shown, the three plots are nested, with plot 210 having the highest swing in range, plot 215 having a range within that of plot 210, and plot 217 having a range within that of plot 215. All three plots nominally run between a CLK+ of 1.0V and a CLK− of 0V, but, as may be clearly seen, only plot 215 is close to the ideal values of 0V and 1.0V. Thus, while typical plot 215, runs between −0.1V and 1.0V, plot 217 tends to have incomplete settling, running between 0.05 V and 0.85 V, while plot 210, has significant overshoot, and actually runs between −0.3 and 1.3V.

Figure 3:
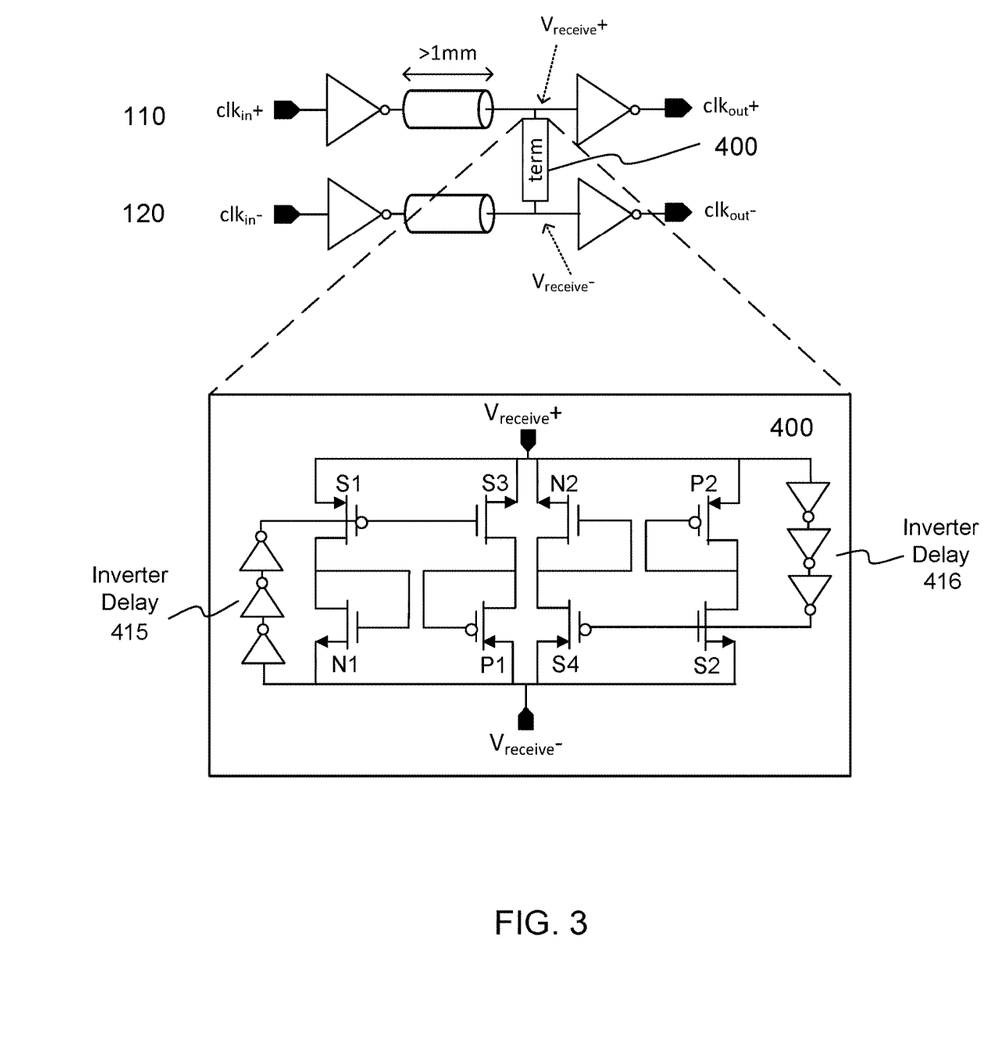
FIG. 3 depicts a long line clock termination circuit, according to some examples.

As noted above, to address this problem, but without causing a large draw on the line driver, various line termination structures are described, beginning with the example termination structure of FIG. 3. FIGS. 4A-4D and 5, depict the same line termination circuit shown in FIG. 3, albeit in greater detail, and in different stages of operation. The example line termination structures of FIGS. 3, 4A-4D and 5, for example, each allow a sink current to run for a limited time interval following a toggling of the clock signal, thereby reducing overshoots on the Vreceive+/− nodes. One intuitive way of understanding how this works is to note that during a rising edge on the Vreceive+ node, current flows into a load capacitor there. The inductance of a long line has a tendency to keep sending the same current (as inductors resist efforts to change the current running through them), so that even after the voltage at Vreceive+ and the voltage at the transmitter have equalized, this current will not instantly cease. A current sink provides an alternate path for this current to flow, so that rather than charging the capacitor (pushing it to ever higher voltage), the current "harmlessly" dissipates.

FIG. 3 depicts a low current line termination structure, according to some examples. The example structure allows a sink current to run for a limited time interval following a toggling of the clock signal, thus not causing a large draw on the line driver. With reference to FIG. 3, there is shown a termination circuit 400 connected between the two clock signal lines 110 and 120. As shown in the magnified version of termination circuit 400 shown at the bottom of FIG. 3, termination circuit 400 includes eight transistors that are used to form four parallel sink current paths. The example termination circuit 400 is implemented in CMOS, and thus has four NMOS devices, and four PMOS devices. Moreover, as may be seen, the example termination circuit has symmetry as well as redundancy, and thus there are two current paths that open during a Vreceive+1→0 transition and two current paths that open during a Vreceive+0→1 transition, as described in detail below. Each of the four current paths includes a switching transistor and a diode connected transistor, connected in series. As noted, for each transition of the clock signal, two current paths open. For both a Vreceive+1→0 transition (and thus a Vreceive− transition from 0→1), and a Vreceive+0→1 transition (and thus a Vreceive− transition from 1→0), one of the two sink current paths consist of first an NMOS switching transistor and PMOS diode while the other consists of a PMOS switching transistor and NMOS diode.

Next described with reference to FIGS. 4A through 4D are details of termination circuit 400, and each of the three successive states that termination circuit 400 goes through following a Vreceive+ transition from 1→0.

Figure 4A:
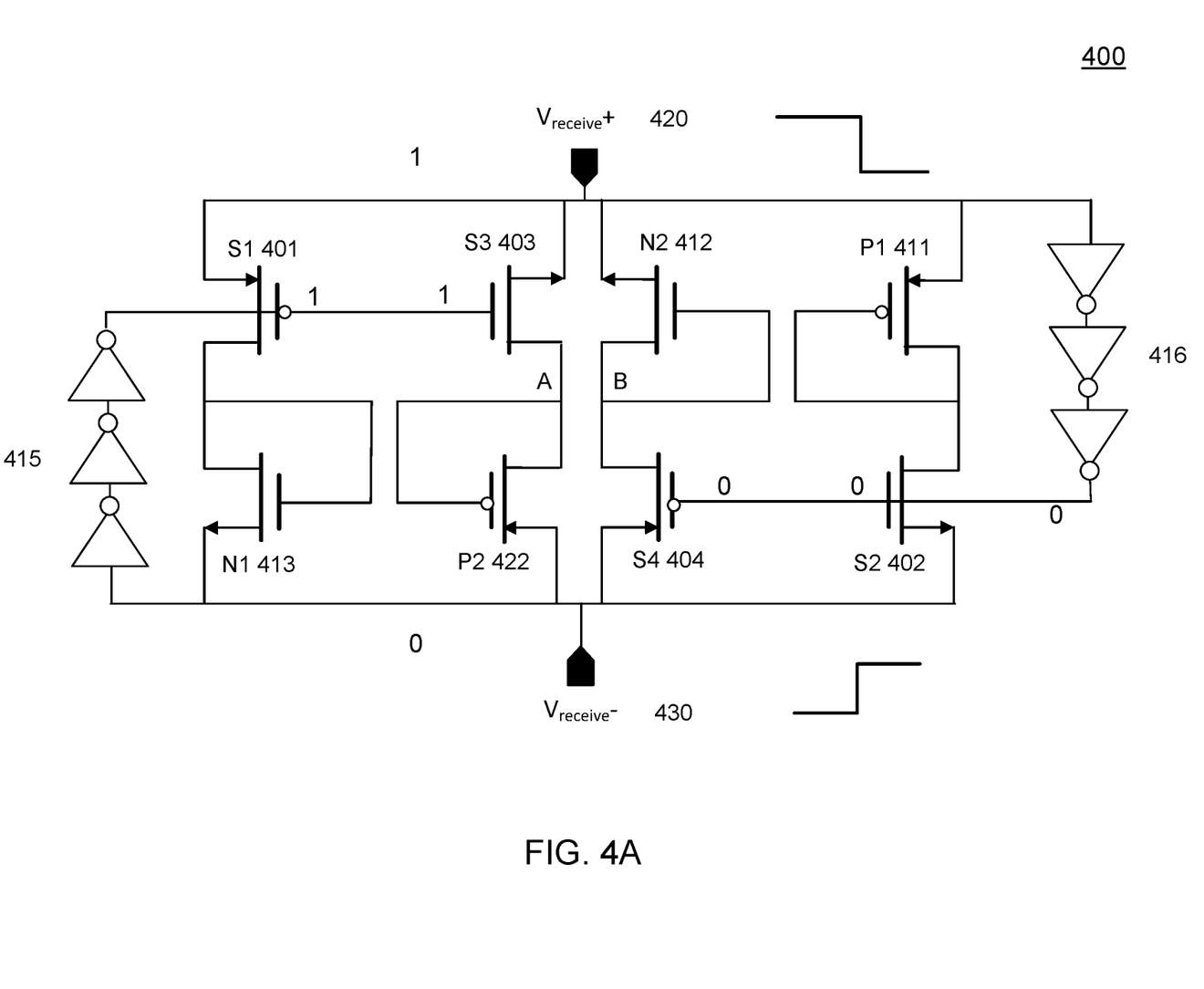
FIG. 4A provides detail of the clock termination circuit shown in FIG. 3.

With reference to FIG. 4A, there is shown example termination circuit 400, in an initial state where Vreceive+

(sometimes referred to herein as CLK+) is at a high value, or a 1, prior to the transition. Similarly, Vreceive− (sometimes referred to herein as CLK−) is at a low value, or a 0, prior to its transition. There are shown within termination circuit 400 four current sink pathways, each with one switching transistor ("ST") and one diode connected transistor ("DCT"). In each path the ST and the DCT are of the opposite transistor type. A first path includes PMOS ST S1 401, and NMOS DCT N1 413, and a second path includes NMOS ST S3 403, and PMOS DCT P2 422. As shown, the gates of the two STs in these two paths are connected, and driven by the output of inverting delay element 415 (sometimes referred to herein as "inverters 415"), which includes, for example, three inverters. The input of inverting delay element 415 is the Vreceive− terminal 430.

Similarly, a third path includes PMOS ST S4 404, and NMOS DCT N2 412, and a fourth and final path includes NMOS ST S2 402, and PMOS DCT P1 411. As shown, the gates of the two STs in the third and fourth current paths are themselves connected, and driven by the output of inverting delay element 416, which includes, for example, three inverters (sometimes referred to herein as "inverters 416"). The input of inverters 416 is the Vreceive+ terminal 420. As shown in FIG. 4A, because Vreceive+ is at 1, the output of inverters 416 is 0, and thus the gates of S4 404 and S2 402 are also at 0. Similarly, because Vreceive− is at 0, the output of inverters 415 is 1, and thus the gates of S1 401 and S3 403 are also at 1.

Figure 4B:
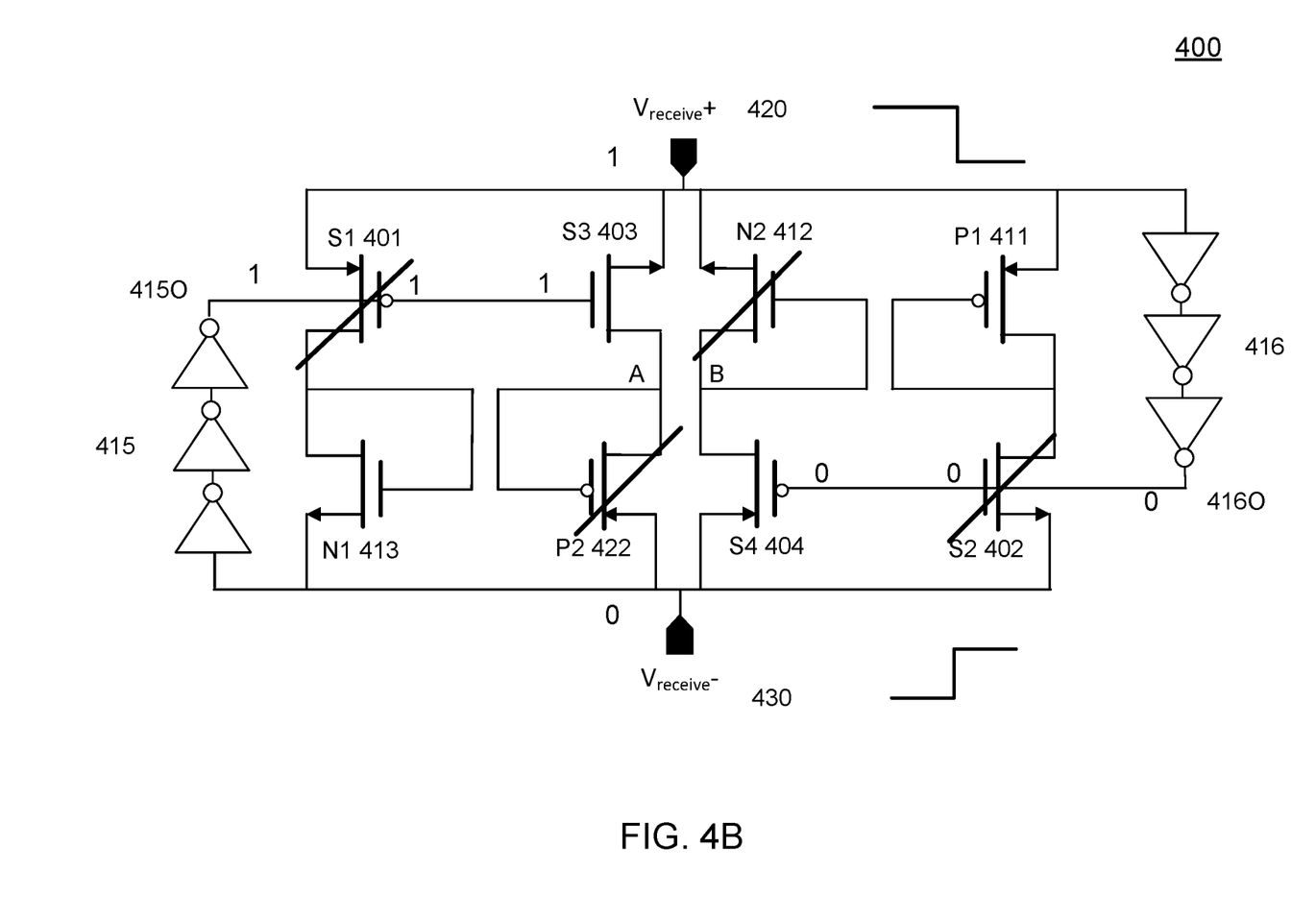
FIG. 4B illustrates the example clock termination circuit of FIG. 4A, illustrating a first step in transition of Vreceive+ from 1 to 0 and Vreceive− from 0 to 1, according to some examples.

FIG. 4B illustrates the example termination circuit of FIG. 4A with the effects of the signal values on each of the Vreceive+ 420, Vreceive− 430, output of inverters 415 and output of inverters 416, to turn on or off the eight transistors. With reference thereto, due to the 1 coming from output node 415O, PMOS S1 401 is off, because its gate is driven by a 1, but NMOS S3 401 is on for the same reason. Similarly, due to the 0 coming from output node 416O, PMOS S4 404 is on, because its gate is driven by a 0, but NMOS S2 402 is off for the same reason. As regards DCT N2 412, its source is at a 1, from Vreceive+, and while its drain may float, at node B, between the voltage rails 1 and 0, because its gate is connected to its floating drain, and its source is a 1, Vgs cannot be greater than 0, and thus the NMOS transistor is off, and the diode reverse biased, and non-conducting. Similarly, as regards DCT P2 422, its source is at a 0, from Vreceive−, and while its drain may float, at node A, between the voltage rails 1 and 0, because its gate is connected to its floating drain, and its source is a 0, Vgs cannot be less than 0, and thus the PMOS transistor is off, and the diode reverse biased, and non-conducting. A diagonal line is drawn through the four transistors that are non-conducting in FIG. 4B. NMOS DCT N1 413 may be conducting, as its source is at 0 and its gate is floating between the voltage rails, so it may have a Vgs>0. Similarly, PMOS DCT P1 411 may also be conducting, as its source is at 1 and its gate is floating between the voltage rails, so it may have a Vgs<0.

Figure 4C:
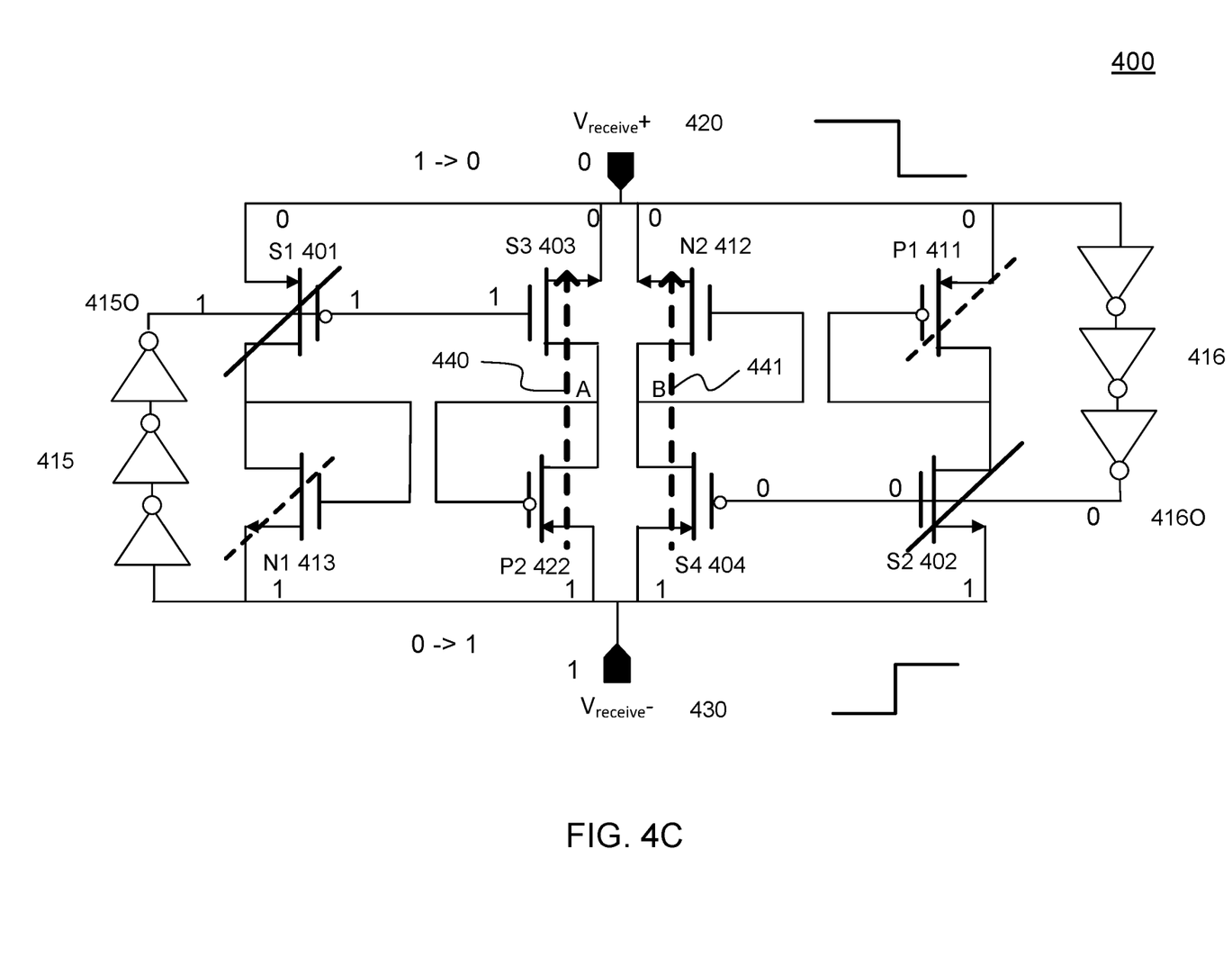
FIG. 4C illustrates the example clock termination circuit of FIGS. 4A and 4B, illustrating a second step in the transition of Vreceive+ from 1 to 0 and Vreceive− from 0 to 1, according to some examples.

FIG. 4C illustrates the example termination circuit of FIG. 4A, now illustrating a second state in the transition of Vreceive+ 420 from 1 to 0 and of Vreceive− 430 from 0 to 1, according to some examples. With reference to FIG. 4C, Vreceive+ 420 has now switched to 0 and Vreceive− 430 has now switched to 1, as shown. However, due to the inherent delay in each inverter of inverters 415 and 416, the output 415O of inverters 415 is still 1, and the output 416O of inverters 416 is still 0, as at this second state, these inverter outputs have not yet switched values. The values of CLK+ and CLK−, and inverter outputs 415O and 416O, now collectively create two current paths in this illustrated second state.

Continuing with reference to FIG. 4C, and by comparison with FIG. 4B, the transistors that have changed between the first state of FIG. 4B and the second state of FIG. 4C, are next described. PMOS DCT P2 422, now has a source voltage of 1, due to the transition. Its drain and gate, connected at node A, may be floating between the voltage rails, but its Vgs cannot be greater than 0. Moreover, its gate and drain are connected to the drain of S3 403, which is on and conducting current due to the gate voltage of 1, and this current flow through S3 403 pulls the voltage at node A towards 0, which is its source voltage. This insures a Vgs<0 for P2 422. As a result a sink current 440 flows between Vreceive− 430 to Vreceive+ 420 through P2 422 and S3 403, as shown.

Similarly, NMOS DCT N2 412, now has a source voltage of 0, due to the transition. Its drain and gate, connected at node B, may be floating between the voltage rails, but its Vgs cannot be less than 0. Moreover, its gate and drain are connected to the drain of PMOS S4 404, which is on and conducting current due to its gate voltage of 0, and this current flow through S4 404 pulls the voltage at node B towards 1, which is its source voltage. This insures a Vgs>0 for N2 412.

Because S3 403 and P2 422 are both on and conducting, there is now a current 440 running through them from Vreceive− to Vreceive+, shown in a dashed line. Similarly, because S4 404 and N2 412 are also both on and conducting, there is now a current 441 running through them from Vreceive− to Vreceive+, also shown in a dashed line.

Finally, with reference to FIG. 4C, N1 413, which may have been conducting in the first state of FIG. 4B due to a floating gate, now has a source voltage of 1, and thus its Vgs cannot exceed 0, as a result it is now off. Similarly, P1 411, which may have been conducting in the first state of FIG. 4B due to its floating gate, now has a source voltage of 0, and thus its Vgs cannot be less than 0, as a result it is now off. A dashed diagonal line has thus been drawn through N1 413 and P1 411 t indicate that they are now off in the second state.

Figure 4D:
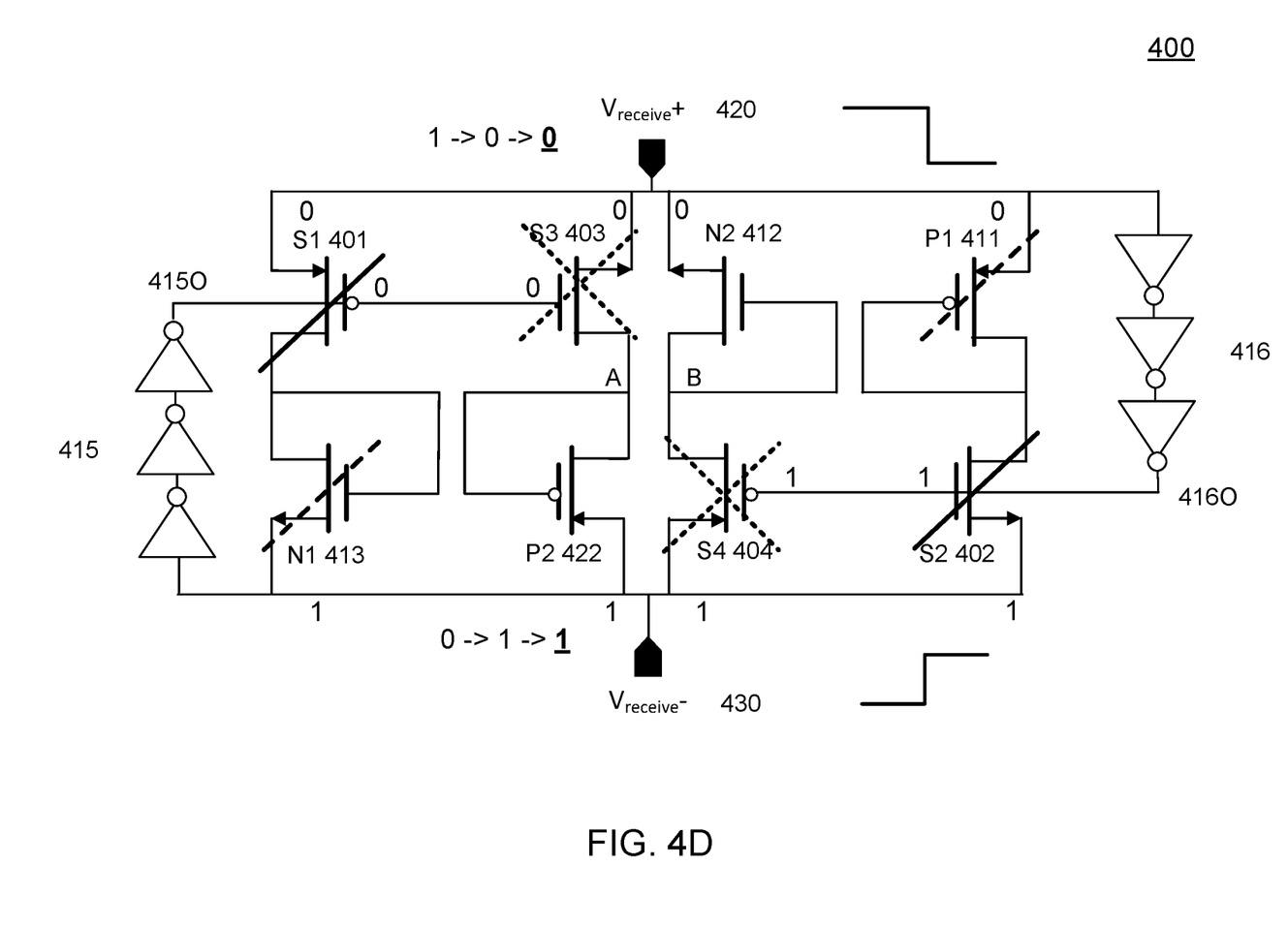
FIG. 4D illustrates the example clock termination circuit of FIGS. 4A through 4C, illustrating a third step in the transition of Vreceive+ from 1 to 0 and Vreceive− from 0 to 1, according to some examples.

FIG. 4D illustrates the example clock termination circuit of FIGS. 4A through 4C, illustrating a third and final state in the transition of Vreceive+ from 1 to 0 and Vreceive− from 0 to 1, according to some examples. This third state occurs following the delay, and thus once the respective inverter outputs 415O and 416O match their inputs Vreceive− and Vreceive+, respectively. Only the changes between the second state of FIG. 4C and the final state of FIG. 4D will be described, as the states of transistors that do not change in the state illustrated in FIG. 4D have already been described above.

With reference to FIG. 4D, new transistors that have turned off relative to the second state of FIG. 4C are illustrated with a dashed line "X". Thus, the two switching transistors S3 403 and S4 404 are now off, and there is no longer the currents 440 and 441 flowing from Vreceive− to Vreceive+. This is because now that the inverter outputs 415O and 416O have caught up to their inputs, 415O is now a 0 and 416O is now a 1. The change of 415O to a 0 now turns off NMOS S3 403, as its gate is now at 0, and thus it has no Vgs. Similarly, the change of 416O to a 1 now turns off PMOS S4 404, as its gate is now at 1, and thus it also has Vgs=0. Once S3 403 and S4 404 turn off, there is no longer a conducting pathway in either current path, and thus the currents that prevailed during the delay period generated by inverters 415 and 416, stop flowing. It is this final state, where the inverter outputs 415O and 416O settle to their post transition values that is indicated in the third digit in the transitions "1→0→0" for Vreceive+ and "0→1→1" for Vreceive−, respectively shown at the top and bottom of FIG. 4D.

Thus, FIGS. 4B, 4C and 4D illustrate a termination circuit that provides a sink current across the clock terminals for a short time interval following a transition. This approach clamps the clock output voltage of the signal lines, but only draws current form the line driver for the time interval of the delay.

Figure 5:
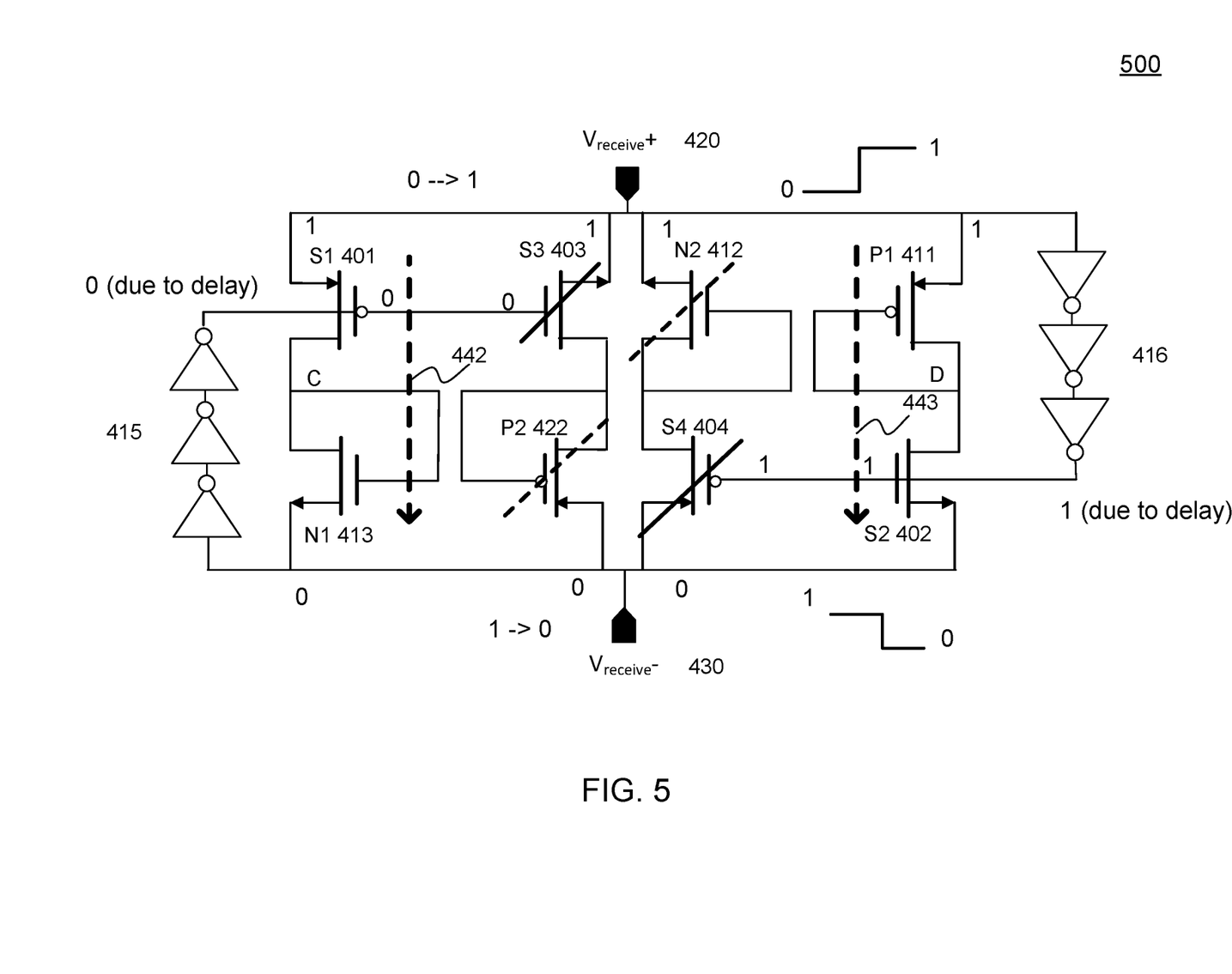
FIG. 5 illustrates the example clock termination circuit of FIG. 4C now undergoing the inverse transition of Vreceive+ from 0 to 1 and Vreceive− from 1 to 0, according to some examples.

FIG. 5 illustrates the example clock termination circuit of FIGS. 4A through 4D, but now illustrating the opposite transition, namely of Vreceive+ from 0 to 1 and Vreceive− from 1 to 0, according to some examples. As may be expected, FIG. 5 illustrates the second state of the termination circuit, which occurs during the time after the clock signals have transitioned, but during the delay interval generated by the inverter delay elements 415 and 416. Thus, FIG. 5 is analogous to, but illustrates the inverse clock signal transition as, that of FIG. 4C.

Thus, in the example of FIG. 5, when Vreceive+ transitions from low to high and Vreceive− from high to low, switching transistors S1 401 and S2 402 turn on, and DCT devices N1 413 and P1 411 also turn on, thus creating a first sink current pathway 442 on the left of the figure, and a second sink current pathway 443 on the right side of the figure, as shown, each running from Vreceive+ to Vreceive−, the inverse direction of pathways 440 and 441 of FIG. 4C. Sink current pathways 442 and 443 only exist as long as inverter output 415O remains at 0, and inverter output 416O remains at 1, as described above. Details as to why these four devices turn on in the second state of the transition illustrated in FIG. 5 is next described.

Continuing with reference to FIG. 5, beginning with current pathway 442, PMOS switching transistor S1 401, due to the inverter delays on output 415O, has a gate voltage of 0, and due to a source voltage now of 1, a negative Vgs of approximately −1, and also a negative Vds, which is the voltage on node C less 1V. The voltage on node C is somewhere between the voltage rails, making Vds<0. Thus, S1 401 is on and conducting. DCT N1 413 also turns on, as its gate voltage is the same as the voltage on node C, somewhere between the voltage rails, and thus it has a positive Vgs with a source voltage of 0. Because S1 401 and N1 413 are both on, current pathway 442 is opened, and a sink current flows from Vreceive+, now at 1 V, to Vreceive−, now at 0V.

Similarly, for current pathway 443, NMOS switching transistor S2 402, due to the inverter delays on output 416O, has a gate voltage of 1, and due to a source voltage now of 0 (from Vreceive−), and also has a positive Vgs of approximately 1, as well as a positive Vds, which is the voltage on node D (Vs being 0). The voltage on node D is somewhere between the voltage rails, making Vds>0. Thus, S2 402 is on and conducting. DCT P1 411 also turns on, as its gate voltage is the same as the voltage on node D, somewhere between the voltage rails, and thus it has a negative Vgs with a source voltage of 1. Because S2 402 and P1 411 are both on, current pathway 443 is opened, and a second sink current flows from Vreceive+, now at 1 V, to Vreceive−, now at 0V.

As was the case with the second stage of FIG. 4C, a short time following the transitions, as defined by the three-inverter delays 415 and 416, switches S1 401 and S2 402 open, turning off the two clamping current paths. This may cause some residual voltage peaking as the inductance of the line connected to this termination structure will initially continue sourcing/sinking the clamping current, which now must flow into the load capacitance of Vreceive+ and Vreceive−. Critically, by correct design of the size of the clamping current paths and delays, in one or more examples this residual overshoot may be made significantly lower than in the absence of the terminating structure, thereby guaranteeing the reliability of devices connected to Vreceive+ and Vreceive−.

Thus, given all of the above descriptions, in the example termination structure of FIGS. 4A-4D and FIG. 5, current from the line drivers is reduced because the termination structure only conducts current for a short amount of time at each transition. In addition, because diodes N1/P1 and N2/P2 each have currents that increase faster than the voltage, the effective load presented by the example termination may be made to be smaller than a simple resistor for a similar TDDB stress, which reduces the jitter penalty.

It is here noted that in several simulations of the example termination structure of FIGS. 4A through 4D and 5 that were run by the inventors, a significant decrease in overshoot was in fact seen.

As noted above, the example termination structures of FIGS. 4A-4D and FIG. 5 decrease overshoot by allowing a sink current to run for a limited time interval following toggling of the clock signal. In one or more examples, it is often desired to determine, to the extent possible, an optimal value of the sink current as well as a preferred duration. In one or more examples, simulators may be utilized for this optimization. Best case/worst case line models and load models may be assessed, and how much (if any) voltage overshoot to allow is analyzed. In some examples, implementing a given design involves choosing a current "shape" of the sink current. If a higher current for a given duration is desired, then the sink current may be increased by increasing the size of the DCT and ST transistors. On the other hand, if the same current is desired for a longer duration, then the delay may be increased, either by using more stages (e.g., adding two additional inverters per stage) or implementing more delay per stage by adjusting the inverter characteristics.

Figure 6:
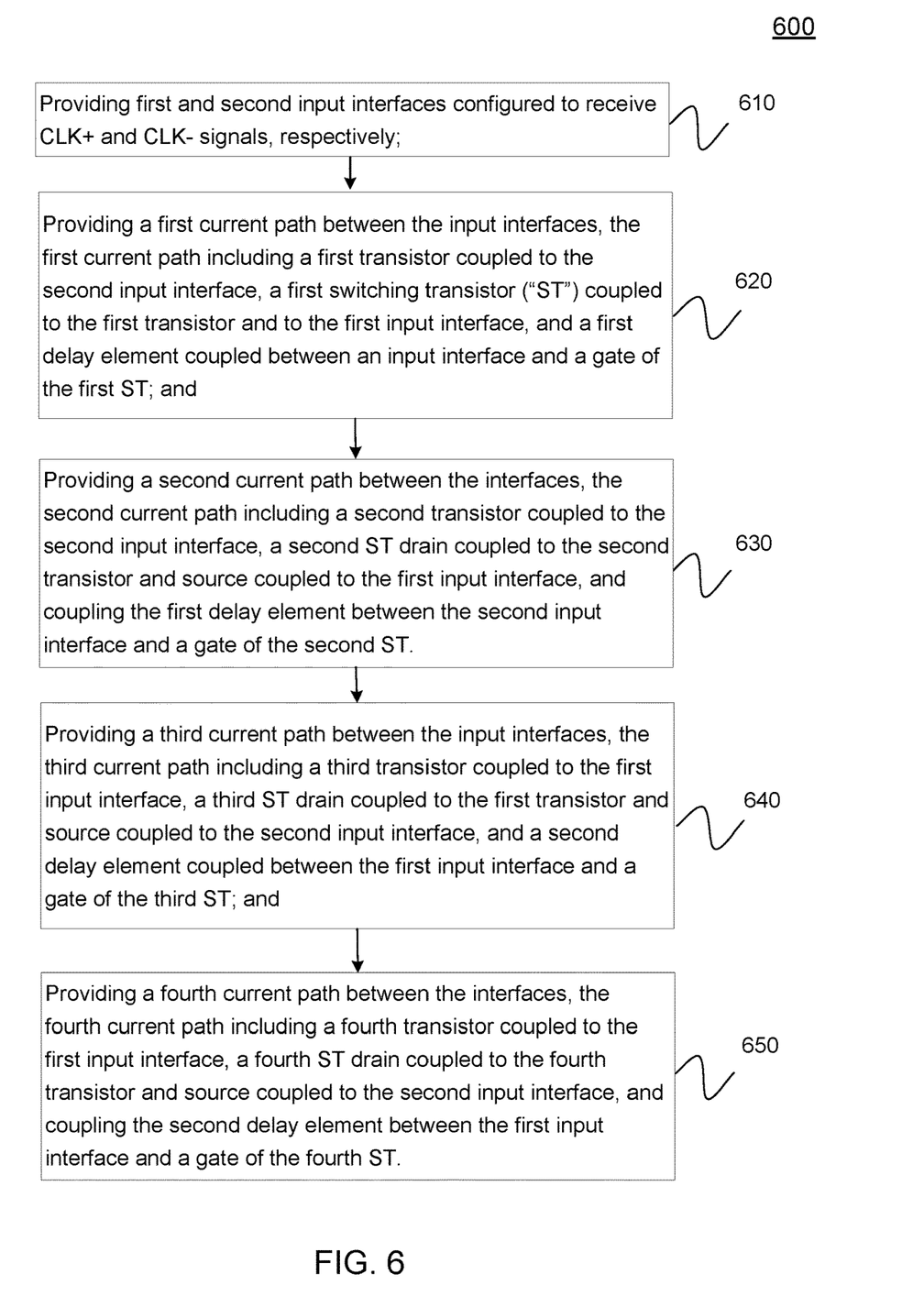
FIG. 6 is a flow diagram of a method of providing a long line clock termination, according to some examples.

FIG. 6 is a flow diagram of a method 600 of providing a long line clock termination, according to some examples.

Method 600 includes blocks 610 through 650. In alternate examples method 600 may include greater, or fewer, blocks. Method 600 begins at block 610, where first and second input interfaces are provided, each input interface configured to receive a Vreceive+ and a Vreceive− voltage, respectively. For example, the input interfaces may be those connected to clock signal lines Vreceive+ 420 and Vreceive− 430, as illustrated, for example, in FIG. 4A.

From block 610 method 600 proceeds to block 620, where a first current path between the input interfaces is provided. The first current path includes a first transistor coupled to the second input interface, a first switching transistor ("ST"), drain coupled to the first transistor and source coupled to the first input interface, and a first delay element coupled between the second input interface and a gate of the first ST. In some examples, the first transistor may be a diode connected transistor ("DCT"). In some examples the first delay element may be an inverting delay element, and may, for example, include an odd number of inverters, such as inverters 415. For example, the first current path may include N1 413 and S1 401 of FIG. 4C or of FIG. 10A, or P2 422 and S3 403 of FIG. 4C or of FIG. 10B.

From block 620 method 600 proceeds to block 630, where a second current path between the interfaces is provided, the second current path including a second transistor coupled to the second input interface, a second ST, drain coupled to the second transistor and source coupled to the first input interface, and the first delay element coupled between the second input interface and a gate of the second ST. In some examples, the second transistor may also be a DCT. For example, the second current path may include P2 422 and S3 403 of FIG. 4C or of FIG. 10B, or S1 401 and N1 403 of FIG. 4C or of FIG. 10A.

From block 630 method 600 proceeds to block 640, where a third current path between the input interfaces is provided, the third current path including a third transistor coupled to the first input interface, a third ST, drain coupled to the third transistor and source coupled to the second input interface, and a second delay element coupled between the first input interface and a gate of the third ST. In some examples, the third transistor may also be a DCT. In some examples the second delay element may be an inverting delay element, and may, for example, include an odd number of inverters, such as inverters 416. For example, the third current path may include S4 404 and N2 412 of FIG. 4C, or P1 411 and S2 402 of FIG. 4C.

From block 640 method 600 proceeds to block 650, where a fourth current path between the interfaces is provided, the fourth current path including a fourth transistor coupled to the first input interface, a fourth ST, drain coupled to the fourth transistor and source coupled to the second input interface, and the second delay element is coupled between the first input interface and a gate of the fourth ST. In some examples, the fourth transistor may also be a DCT For example, the fourth current path may include P1 411 and S2 402 of FIG. 4C, or FIG. 4C or S4 404 and N2 412 of FIG. 4C. Method 600 terminates at block 650.

Figure 7:
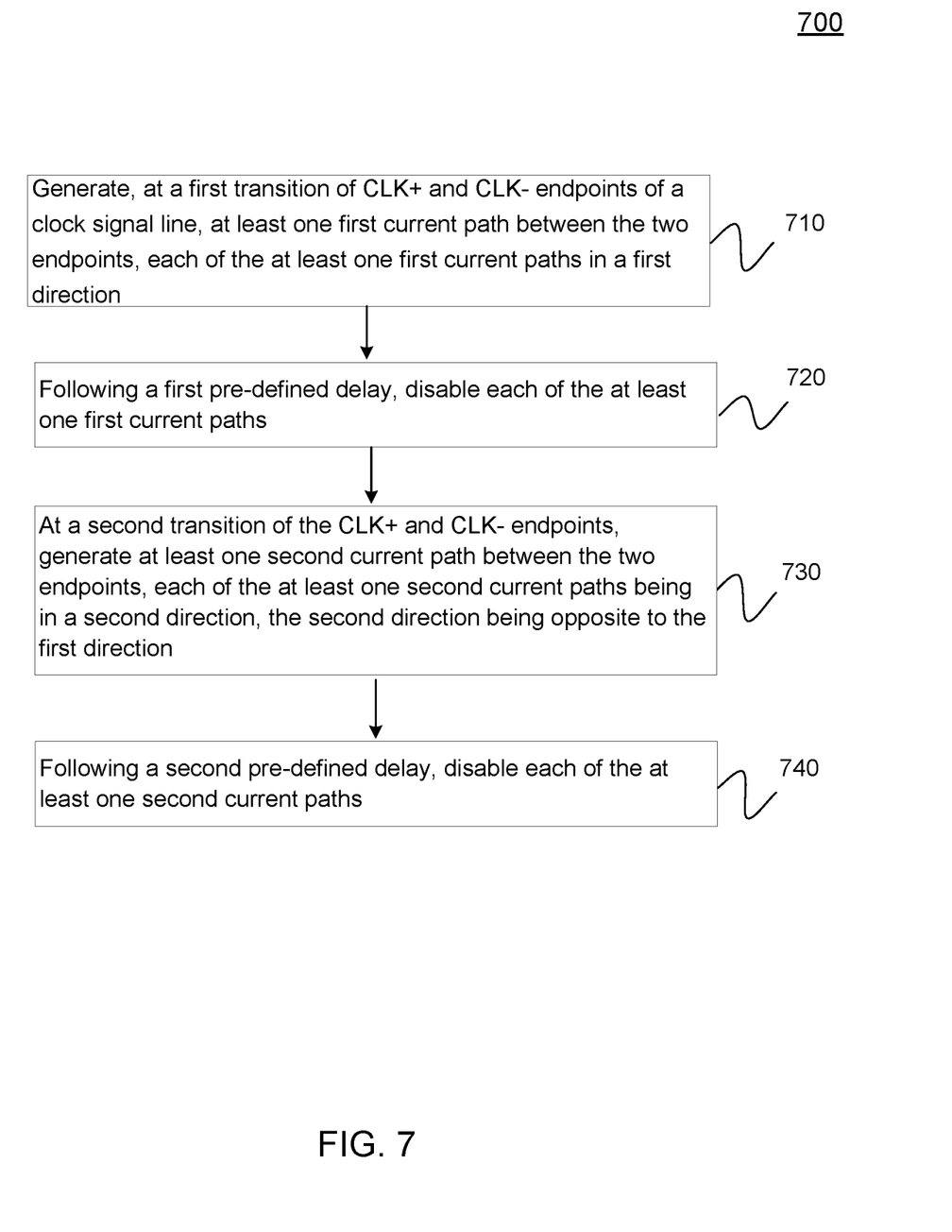
FIG. 7 is a flow diagram of a method for providing a low sink current between two endpoints of a clock line, according to some examples.

FIG. 7 is a flow diagram of a method for providing a low sink current between two endpoints of a clock line, according to some examples. Method 700 includes blocks 710 through 740. In alternate examples method 700 may include greater, or fewer, blocks. Method 700 begins at block 710 where at a first transition of CLK+ and CLK− endpoints of a clock signal line, at least one first current path is generated between the two endpoints, each of the at least one first current paths being in a first direction. For example, there may be two current paths, and these may be current paths 410 and 411 of FIG. 4C

From block 710, method 700 proceeds to block 720, where, following a first pre-defined delay, each of the at least one first current paths is disabled. For example, this may be the situation depicted in FIG. 4D, once the delays generated by inverters 415 and 416 have elapsed.

From block 720, method 700 proceeds to block 730, where, at a second transition of the CLK+ and CLK− endpoints, at least one second current path between the two endpoints is generated, each of the at least one second current paths being in a second direction, the second direction being opposite to the first direction. For example, there may be two current paths, and these may be current paths 412 and 413 of FIG. 5

From block 730, method 700 proceeds to block 740, where, following a second pre-defined delay, each of the at least one second current paths is disabled. For example, this may be the situation following that shown in FIG. 5, once the delays generated by inverters 415 and 416 have elapsed. Method 700 terminates at block 740.

Although the termination circuit of FIGS. 4A through 4D, and also of FIG. 5, has two redundant current pathways in each direction, this is not necessary, and in alternate embodiments, there may be a single current pathway in each direction, associated with each respective type of transition, as described above. FIGS. 8, 9, 10A and 10B illustrate example alternate termination circuits, of this type, made using all NMOS, all PMOS, or CMOS, but only one type for the diode connected transistors. These are next described.

As regards example embodiments with only one current pathway in each direction, it is noted that while in theory the current path flows from one end of the terminating structure to the other, in practice there are internal parasitic capacitors that will result in the current on both ends not being exactly the same at all times. For example, initially some current from Vreceive+ may charge internal termination parasitics as opposed to flowing out of Vreceive−. Thus, in some cases using only one current path per transition may result in a different overshoot when transitioning from 0 to 1 than when transitioning from 1 to 0. In one or more examples, this is not a problem. However, if better overshoot symmetry is desired, the fully complementary versions of the examples of FIGS. 4A-4D and 5 may be used.

Figure 8:
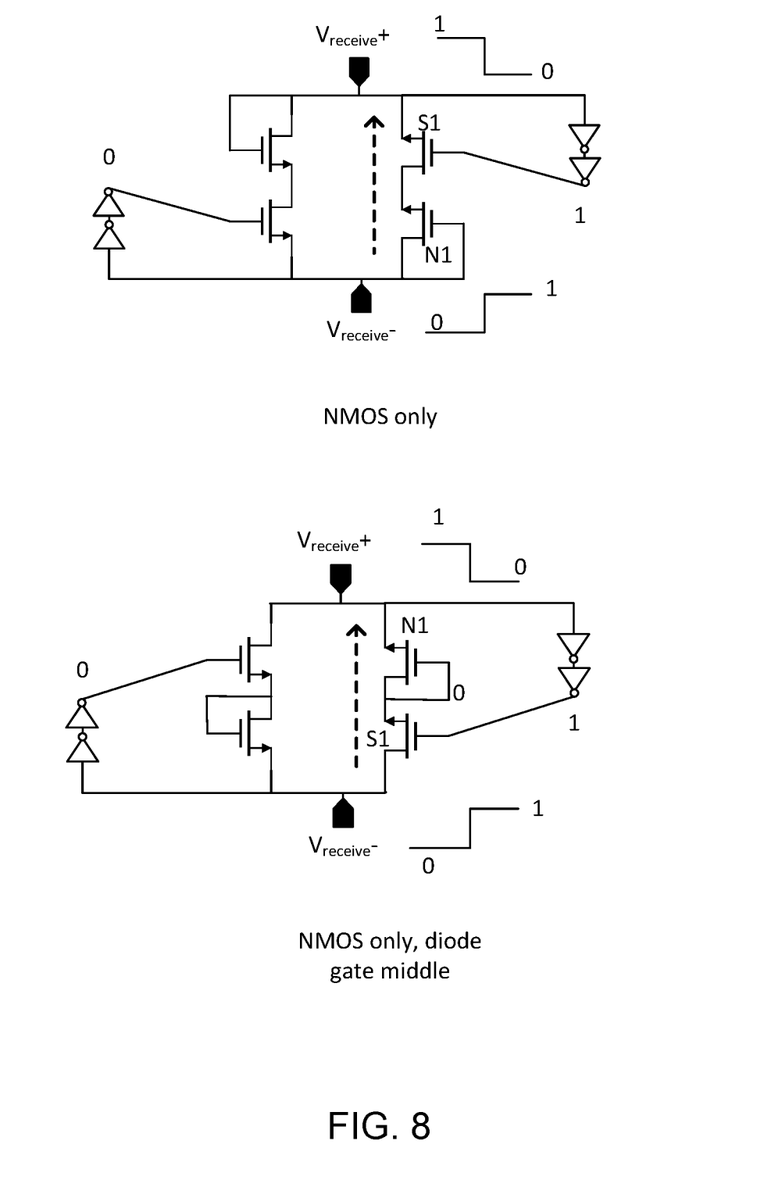
FIG. 8 illustrates alternate NMOS long line clock termination circuits, according to some examples.

FIG. 8 illustrates alternate line termination circuits made using only NMOS devices, according to some examples. With reference to FIG. 8, there may be an all NMOS termination circuit, with NMOS STs and NMOS DCTs, as shown. In the two variations shown, the positon of the two DCTs relative to the inverter outputs may be varied. Thus, in the upper circuit, the switching transistors are adjacent to the same clock line from which their gate voltages derive, after passing through the inverters, or, as in the lower circuit, the NMOS DCTs are connected between the switching transistors and the clock line from which the STs' gate voltages derive. The sink current is illustrated for the Vreceive+ transition between 1 and 0, and for the other transition the sink current would be on the left side current path in each figure, running in the opposite direction, from Vreceive+ down to Vreceive−.

Figure 9:
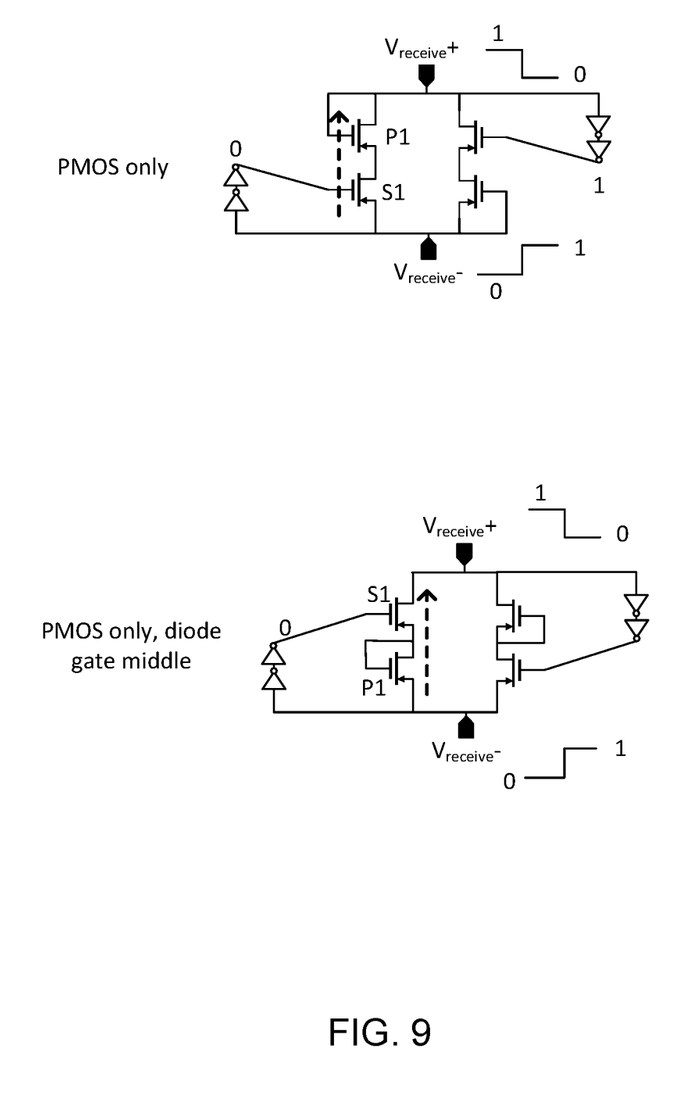
FIG. 9 illustrates alternate PMOS long line clock termination circuits, according to some examples.

Similarly, FIG. 9 illustrates alternate line termination circuits made using only PMOS devices, according to some examples. With reference to FIG. 9, there may be an all PMOS termination circuit, with PMOS STs and PMOS DCTs, as shown. In the two variations shown, the positon of the two DCTs relative to the inverter outputs may be varied. Thus, in the upper circuit, the switching transistors are adjacent to the same clock line from which their gate voltages derive, after passing through the inverters. Alternatively, as shown in the lower circuit, the PMOS DCTs are connected between the switching transistors and the clock line from which the STs' gate voltages derive. The sink current is illustrated for the Vreceive+ transition between 1 and 0, and for the other transition the sink current would be on the right side current path in each figure, running in the opposite direction, from Vreceive+ down to Vreceive−.

Figure 10A:
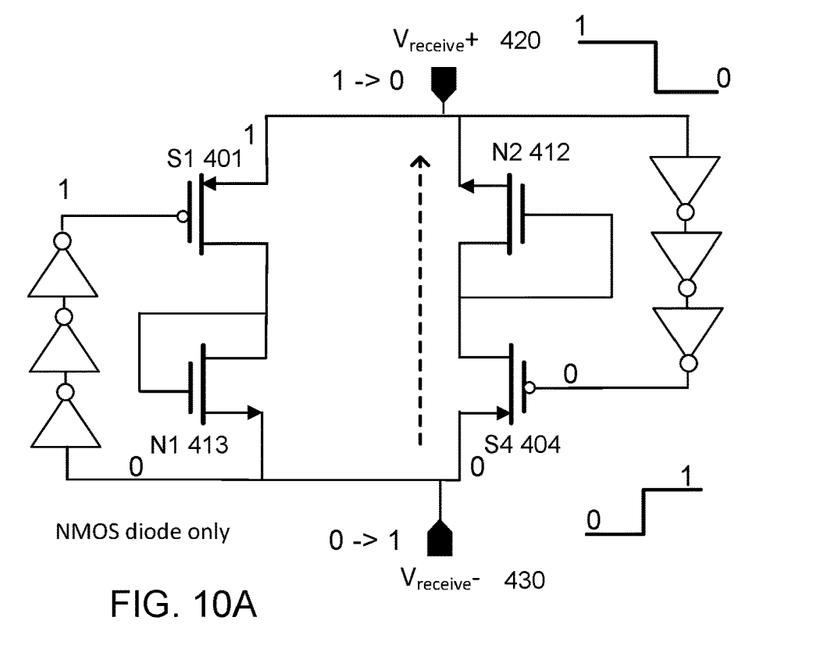
FIGS. 10A and 10B illustrate alternate NMOS and PMOS diode only long line clock termination circuits, according to some examples.
Figure 10B:
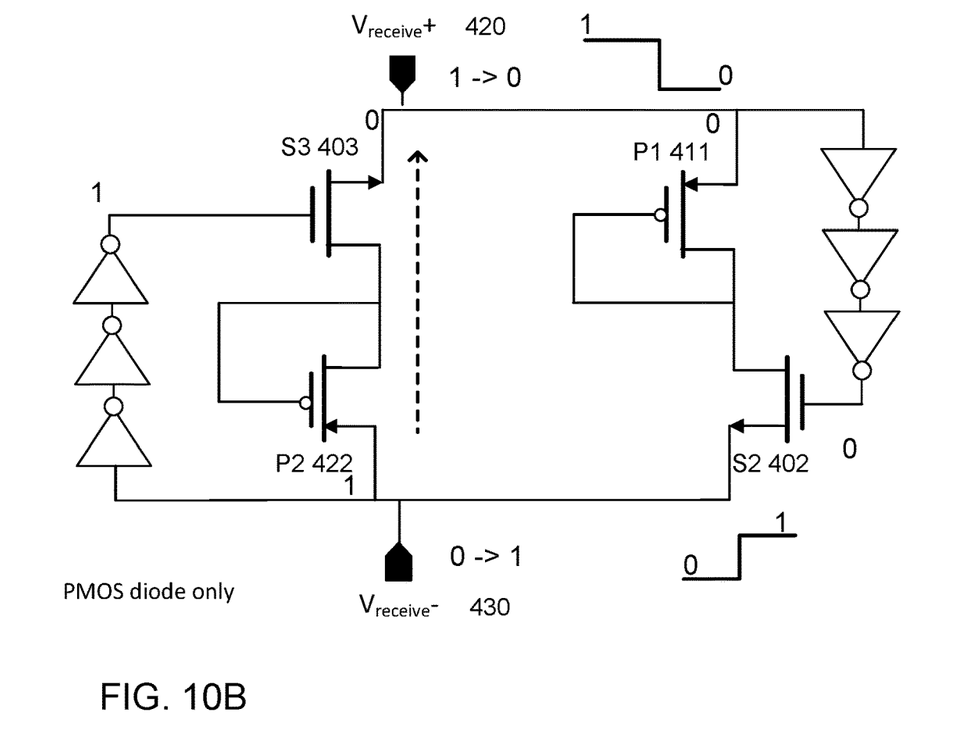

FIGS. 10A and 10B illustrate CMOS devices, but where the DCTs are of only one type, either NMOS or PMOS, according to some examples. With reference to FIG. 10A, it is noted that this example termination circuit is a subset of that of FIG. 4A, for example, using the current paths S1 401 and N1 413, and also N2 412 and S4 404. Similarly, the example termination circuit of FIG. 108, is also a subset of that of FIG. 4A, using the remaining two current paths, namely, S3 403 and P2 422, and also P1 411 and S2 402. These circuits operate in exactly the same manner as described above with reference to FIGS. 4A through 4D and 5. In FIGS. 10A and 10B only the sink current for a transition of Vreceive+ going from 1 to 0 is shown, the other transition, of Vreceive+ going from 0 to 1 would operate exactly as illustrated in FIG. 5, but for only one current path.

Thus, according to one or more examples, voltage overshoot at the end of inductive lines is reduced by providing a current sink. As opposed to conventional terminating structures that require significant current, example termination circuits as described herein reduce current requirements on a line driver by disabling the terminating current after a short amount of time, determined by the delay of two respective sets of inverters provided in the various termination circuits according to various examples.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to specific examples, other and further examples may be devised without departing from the basic scope thereof, and the scope thereof is determined by the claims that follow.

What is claimed is:

1. A low current line termination structure, comprising:
   first and second input interfaces each configured to receive CLK+ and CLK− voltages, respectively;
   a first diode connected transistor ("DCT") coupled to the second input interface;
   a first switching transistor ("ST") coupled to the first DCT and the first input interface;
   a first delay element coupled between one of the first and second input interfaces and a gate of the first ST;
   a second DCT coupled to the first input interface;
   a second ST coupled to the second DCT and to the second input interface; and
   a second delay element coupled between another of the first and second input interfaces and a gate of the second ST.

2. The line termination structure of claim 1, wherein at least one of the first delay element and the second delay element is an inverting delay element.

3. The line termination structure of claim 2, wherein the inverting delay element comprises at least two inverters in series.

4. The line termination structure of claim 1, wherein:
   the first DCT is source connected to the second input interface and drain connected to the first ST; and
   the first delay element is connected between the second input interface and a gate of the first ST.

5. The line termination structure of claim 4, wherein:
   the first DCT is an NMOS transistor and the first ST a PMOS transistor; or
   the first DCT is a PMOS transistor and the first ST is an NMOS transistor.

6. The line termination structure of claim 1, wherein:
   the second DCT is source connected to the first input interface and drain connected to the second ST; and
   the second delay element is connected between the first input interface and a gate of the second ST.

7. The line termination structure of claim 6, wherein:
   the second DCT is a PMOS transistor and the second ST an NMOS transistor; or
   the second DCT is an NMOS transistor and the second ST a PMOS transistor.

8. The line termination structure of claim 6, further comprising:
   a third DCT is source connected to the second input interface; and
   a third ST is source connected to the first input interface and drain connected to the third DCT source,
   wherein a gate of the third ST is connected to the first delay element.

9. The line termination structure of claim 8, further comprising:
   a fourth DCT is source connected to the first input interface; and
   a fourth ST is source connected to the second input interface and drain connected to the fourth DCT,
   wherein a gate of the fourth ST is connected to the second delay element.

10. The line termination structure of claim 9, wherein each of the first delay element and the second delay element comprises an odd number of inverters.

11. A method of providing a low current line termination circuit, comprising:
    providing first and second input interfaces configured to receive CLK+ and CLK− signals, respectively;
    providing a first current path between the first and second input interfaces, the first current path including:
      a first diode connected transistor ("DCT") coupled to the second input interface;
      a first switching transistor ("ST") coupled to the first DCT and the first input interface; and
      a first delay element coupled between one of the first and second input interfaces and a gate of the first ST;
    providing a second current path between the first and second input interfaces, the second current path including:
      a second DCT coupled to the first input interface;
      a second ST coupled to the second DCT and to the second input interface; and
      a second delay element coupled between another of first and second two input interfaces and a gate of the second ST.

12. The method of claim 11, wherein at least one of the first delay element and the second delay element is an inverting delay element comprising at least two inverters in series.

13. The method of claim 11, further comprising:
    connecting a source of the first DCT to the second input interface and connecting a drain of the first DCT to a drain of the first ST; and
    connecting the first delay element between the second input interface and a gate of the first ST.

14. The method of claim 11, further comprising:
    connecting a source of the second DCT to the first input interface and connecting a drain of the second DCT to a drain of the second ST; and
    connecting the second delay element between the first input interface and a gate of the second ST.

15. The method of claim 11, further comprising:
    connecting a source of a third DCT to the second input interface;
    connecting a source of a third ST to the first input interface and connecting a drain of the third ST to a drain of the third DCT; and
    connecting a gate of the third ST to the first delay element.

16. The method of claim 15, further comprising:
    connecting a source of a fourth DCT to the first input interface;
    connecting a source of a fourth ST to the second input interface and a drain of the fourth ST to a drain of the fourth DCT; and
    connecting a gate of the fourth ST to the second delay element.

* * * * *